United States Patent
Burkhart et al.

(10) Patent No.: US 6,722,665 B1
(45) Date of Patent: Apr. 20, 2004

(54) MESC SEAL, O-RING CARRIER

(75) Inventors: Christopher W. Burkhart, Los Gatos, CA (US); Keith Wood, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/067,489

(22) Filed: Feb. 4, 2002

(51) Int. Cl.[7] ................................................ F16J 15/02
(52) U.S. Cl. ......................... 277/637; 277/630; 277/613
(58) Field of Search ................................. 277/602, 603, 277/608, 609, 616, 630, 637

(56) References Cited

U.S. PATENT DOCUMENTS

| | | | | |
|---|---|---|---|---|
| 2,462,762 A | * | 2/1949 | Nardin ........................ 277/609 |
| 3,167,322 A | * | 1/1965 | Aichroth ...................... 277/453 |
| 3,573,870 A | * | 4/1971 | Gastineau et al. ............ 277/609 |
| 3,573,873 A | * | 4/1971 | Pearson ....................... 277/610 |
| 3,909,011 A | * | 9/1975 | Sheesley ....................... 277/609 |
| 4,002,344 A | | 1/1977 | Smith |
| 4,095,809 A | | 6/1978 | Smith |
| 4,155,571 A | * | 5/1979 | Gastineau et al. ............. 285/24 |
| 4,631,786 A | | 12/1986 | Curry |
| 4,866,934 A | * | 9/1989 | Lindstedt ...................... 60/321 |
| 5,366,261 A | * | 11/1994 | Ohmi et al. .................. 285/328 |
| 5,409,270 A | * | 4/1995 | Shinohara et al. ........... 285/379 |
| 6,267,386 B1 | * | 7/2001 | Loll et al. .................... 277/654 |
| 6,409,180 B1 | * | 6/2002 | Spence et al. ............... 277/608 |

* cited by examiner

Primary Examiner—Anthony Knight
Assistant Examiner—E Peavey
(74) Attorney, Agent, or Firm—DeLio & Peterson, LLC; Kelly M. Reynolds

(57) ABSTRACT

A sealing assembly is provided for sealing retractable opposing planar surfaces of processing modules each having sealable cavities for the fabrication of semiconductor wafers. The sealing assembly may include an inner frame adapted to be concentrically positioned within a central opening of an outer frame. The outer frame may include lifting tabs attached to an upper portion such that the lifting tabs are graspable to removably position the sealing assembly between the opposing planar surfaces of the processing modules. An O-ring, which may include an elastomeric material, is adapted to fit about a circumference of the inner frame. The opposing surfaces of the processing modules define an opening therebetween which accepts the sealing assembly. The opposing surfaces of the modules are retractably movable towards one another thereby coupling the O-ring between the opposing planar surfaces to provide a seal.

21 Claims, 11 Drawing Sheets

MESC SEAL, O-RING CARRIER

BACKGROUND OF THE INVENTION

1. Field of the Invention

The present invention relates generally to a sealing assembly for sealing between processing modules, and more particularly, a sealing assembly providing a seal between MESC modules in the fabrication of semiconductor wafers.

2. Description of Related Art

Known sealing device for creating a seal against pressure or vacuum between flanges includes using O-rings partially fitted within a groove. The O-ring may deform under stress and partially fill a groove to provide a seal between flanges.

Commonly in sealing devices, O-rings become worn or damaged over time from the pressure exerted on them, and compression of the O-ring exerted from flanges. Typically the O-rings may be replaced yearly or at other more frequent intervals. O-rings may be used between a DLCM module (Dual-Loadlock Cassette Module) and a SPEED (Simultaneous Profile Enhancement by Etch and Deposition) module or other similar processing modules or units. The O-ring may be located in a dovetail groove on the DLCM. Replacing damaged O-ring seals between the DLCM and SPEED modules commonly requires extensive procedures for undocking and re-docking the speed module from the DLCM.

More particularly, attached equipment to the modules must be disconnected and/or turned off before moving the equipment. The modules themselves are undocked and manipulated to typically create a 2–3 inch opening between the modules. The opposite procedure must be employed to re-dock and test the modules, calibrate equipment, and perform any additional tests. Any accessory equipment must also be reconnected, and tested. The opening created between the modules must be adequate to allow sufficient access to the O-ring which is to be replaced, and also must be sufficient to allow a new O-ring to be positioned between the modules before re-docking the modules.

Specifically, undocking can include disconnecting gas lines, physically moving the module, reassembling the modules, reconnecting the gas line, recalibration, qualification, and testing of the docked SPEED module after reassembly. System down time can also be significant while executing these procedures.

Considerably large processing modules, as the preferred SPEED and DLCM modules, are not particularly mobile and do not lend themselves easily to physical manipulation. More specifically, the structures which houses each of the modules must be urged and manipulated to create a space for replacing the O-ring seal. Thus, the undocking procedure of the modules may include preparation of the facilities, preparing a gas source and gas lines, disengaging the modules and separating them to remove the O-ring seal. After replacing the O-ring seal, the modules gas lines and any other equipment needs to be reengaged, and test procedures performed.

Consequently, a disadvantage of current methods is the extensive procedures needed when replacing the O-ring which affects other equipment and includes site and equipment preparation, skilled handling of all the equipment involved, and considerable down time when replacing the O-ring seal. Another disadvantage of known devices and methods for replacing the O-ring seal is that the opening between the modules disrupts the considerably sized processing modules and their related support structure, as well as, other equipment when producing the typical 2–3 inch opening, and if a larger opening is needed, the disadvantages increase proportionally. Thus, the larger the opening between the modules, the more undesirable because of the effect on other equipment, complexity of preparation, procedures, and testing thereafter.

Therefore, significant movement of processing modules or units such as SPEED and DLCM modules has many disadvantages. Further, known devices and methods for replacing O-ring seals to do not address nor resolve the problems, or provide a solution to the disadvantages. Therefore, a need exists for a sealing device which will resolve the problems and disadvantages known in the prior art.

Bearing in mind the problems and deficiencies of the prior art, it is therefore an object of the present invention to provide a sealing assembly which results in easier seal replacement between processing modules.

It is another object of the present invention to provide a sealing assembly which carries an O-ring seal.

It is another object of the present invention to provide a sealing assembly which results in increased efficiency when replacing seals.

It is another object of the present invention to provide a sealing assembly which minimizes the opening needed between processing modules when replacing a sealing member.

It is yet another object of the present invention to provide a sealing assembly which provides a gas and liquid tight seal.

It is another object of the present invention to provide a sealing assembly which is efficiently assembled.

It is a further object of the present invention to provide a sealing assembly which allows compression and expansion of an O-ring sealing member without damaging the O-ring sealing member.

It is a further object of the present invention to provide a more efficient method for replacing a sealing member.

It is yet another object of the present invention to provide a method which minimizes the opening needed between processing modules when replacing a sealing member.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a sealing assembly for sealing retractable opposing planar surfaces of processing modules each having sealable cavities for the fabrication of semiconductor wafers. A removable O-ring, which may include an elastomeric material, is coupled to the sealing assembly and positioned along a receiving surface of the sealing assembly such that the O-ring is contiguously exposed and adapted to receive at least one planar surface of the processing modules. At least one lifting tab is attached to an upper portion of the sealing assembly such that the lifting tab is graspable to removably position the sealing assembly between the opposing planar surfaces of the processing modules thereby providing a seal.

In a related aspect the present invention provides a lifting tab extending outwardly at about a 90° angle from a plane defined by the receiving surface of the sealing assembly.

In another related aspect the present invention includes an alignment element being adapted to couple to at least one processing module such that the sealing assembly is horizontally and vertically positioned in relation to the processing modules.

In yet another related aspect the present invention the sealing assembly further includes an outer frame defining a substantially central opening and an inner frame being adapted to be concentrically positioned within the central opening of the outer frame. The O-ring is adapted to fit about a circumference of the inner frame, and the O-ring is juxtapositioned between the concentrically positioned inner and outer frames such that the O-ring removably couples the inner and outer frames.

In a further related aspect the present invention includes the concentrically positioned inner and outer frames defining a channel therebetween adapted for removable receiving the O-ring. The inner frame includes an outer edge having a recessed portion complementarily receiving an inwardly protruding portion along an inner edge of the outer frame, and where compressing the O-ring expands the O-ring into the channel. The inner frame may have a thickness dimension which is greater than a thickness dimension of the outer frame, and a planar surface of the inner frame complimentarily contacts the planar surfaces of the processing modules.

In another related aspect the present invention the opposing surfaces of the processing modules defining an opening therebetween and the removable sealing assembly is adapted to fit into the opening between the opposing planar surfaces of the processing modules. The opposing surfaces of the modules are movable towards one another coupling the O-ring between the opposing planar surfaces, thereby providing a seal between the opposing planar surfaces of the processing modules.

In another aspect the present invention provides a sealing assembly for sealing retractable opposing planar surfaces of processing modules each having sealable cavities for the fabrication of semiconductor wafers. An outer frame defines a substantially central opening and an inner frame is adapted to be concentrically positioned within the central opening of the outer frame. The outer frame may include lifting tabs attached to an upper portion of the outer frame such that the lifting tabs are graspable to removably position the sealing assembly between the opposing planar surfaces of the processing modules thereby providing a seal. The lifting tabs may extend outwardly at about a 90° angle from a plane defined by the sealing assembly and parallel to the opposing planar surfaces. An O-ring, which may include an elastomeric material, is adapted to fit about a circumference of the inner frame. The O-ring is juxtapositioned between the concentrically positioned inner and outer frames such that the O-ring removably couples the inner and outer frames.

In a related aspect the present invention provides concentrically positioned inner and outer frames defining a channel therebetween adapted for removable receiving the O-ring. The inner frame includes an outer edge having a recessed portion complementarily receiving an inwardly protruding portion positioned along an inner edge of the outer frame, and compressing the O-ring expands the O-ring into the channel. The inner frame may include a thickness dimension which is greater than a thickness dimension of the outer frame, and a planar surface of the inner frame complimentarily contacts the planar surfaces of the processing modules.

In another related aspect the present invention the opposing surfaces of the processing modules define an opening therebetween which may be less than about 0.25 inches, and even less than about 0.1 inches. The removable sealing assembly is adapted to fit into the opening between the opposing planar surfaces of the processing modules. The opposing surfaces of the modules are retractably movable towards one another thereby coupling the O-ring between the opposing planar surfaces to provide a seal between the opposing planar surfaces of the processing modules.

In yet another related aspect the present invention provides that the outer frame defines a concave shaped groove adapted for receiving the O-ring.

In a further related aspect the present invention includes an alignment element being adapted to couple to at least one processing module such that the sealing assembly is horizontally and vertically positioned in relation to the processing modules.

A further aspect of the present invention provides a method of replacing an O-ring seal from between retractable opposing planar surfaces of processing modules having sealable cavities for use in the fabrication of semiconductor wafers. The sealing assembly has a removable O-ring seated within the sealing assembly. The O-ring is contiguously exposed along a receiving surface of the sealing assembly, and the sealing assembly is positioned between and coupled to the opposing planar surfaces of the processing modules when in a closed position. The opposing planar surfaces of the processing modules move away from each other into an open position such that the opposing surfaces define an opening for removing the sealing assembly from between the opposing planar surfaces. The opening defined by the opposing planar surfaces may be less than about 0.25 inches, and may also be less than about 0.1 inches. The sealing assembly is removed using a lifting tab attached to an upper portion of the sealing assembly and the O-ring is replaced and seated within the sealing assembly. The sealing assembly is mounted between the opposing planar surfaces of the processing modules. The opposing surfaces are moved towards one another into the closed position such that the opposing planar surfaces of the processing modules couple with the O-ring thereby providing a seal between the opposing surfaces.

BRIEF DESCRIPTION OF THE DRAWINGS

The features of the invention believed to be novel and the elements characteristic of the invention are set forth with particularity in the appended claims. The FIGS. are for illustration purposes only and are not drawn to scale. The invention itself, however, both as to organization and method of operation, may best be understood by reference to the detailed description which follows taken in conjunction with the accompanying drawings in which:

FIG. 6C is a side elevational view of the inner frame shown in FIGS. 6 and 6a.

DESCRIPTION OF THE PREFERRED EMBODIMENT(S)

Figure 1:
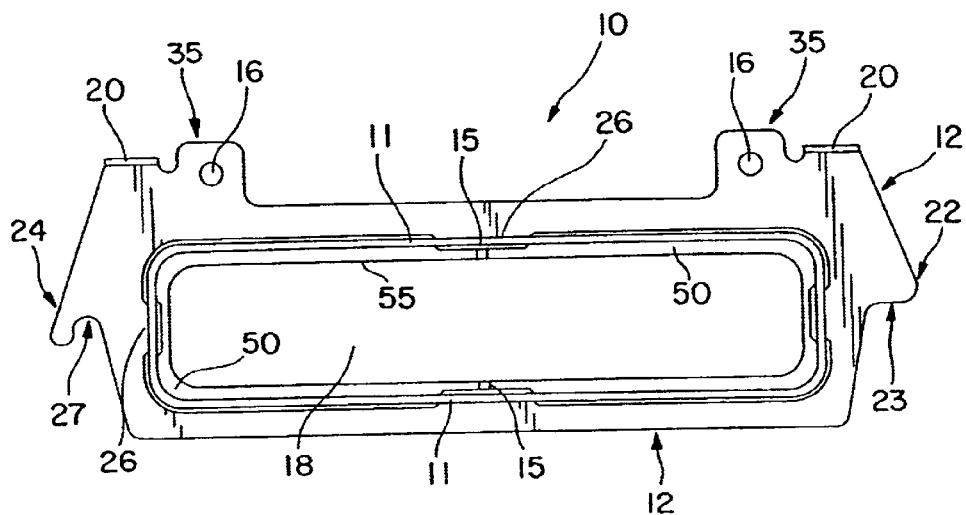
FIG. 1 is a front elevational view of a sealing assembly according to a preferred embodiment of the present invention including outer and inner frames, and an O-ring sealing member.

In describing the preferred embodiment of the present invention, reference will be made herein to FIGS. 1–12 of the drawings in which like numerals refer to like features of the invention. Features of the invention are not necessarily shown to scale in the drawings.

The present invention, depicted in FIGS. 1–12, provides a sealing assembly which includes, in a preferred embodiment, inner and outer frames 12 and 50, respectively, coupled by a removable O-ring, and including lifting tabs for removing and replacing the sealing assembly between process modules or units. The outer frame 12 and the inner frame 50 have complementary inwardly projecting elements 26, and recessed areas 52. The O-ring is positioned between concentrically positioned inner and outer frames, and also between the complimentary inwardly projecting elements 26 and the recessed areas 52 of the outer and inner frames.

Figure 1A:
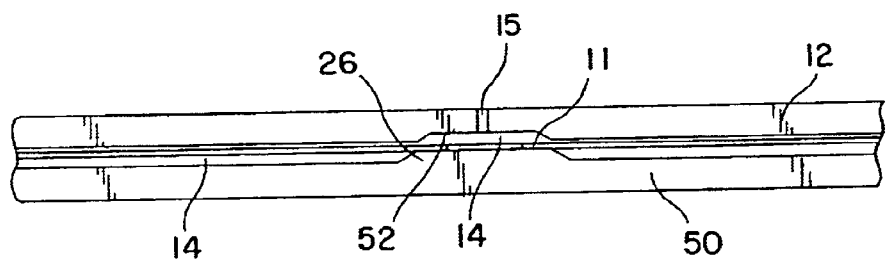
FIG. 1A is a detail view of a portion of the sealing assembly of FIG. 1.
Figure 2:
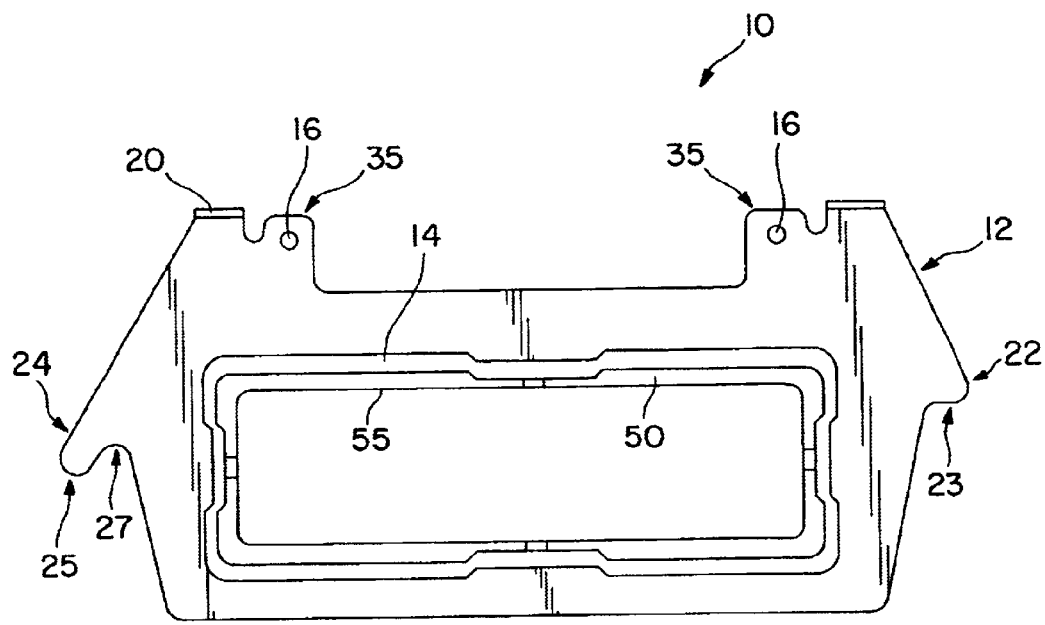
FIG. 2 is a front elevational view of the sealing assembly of the present invention without the O-ring.
Figure 3:
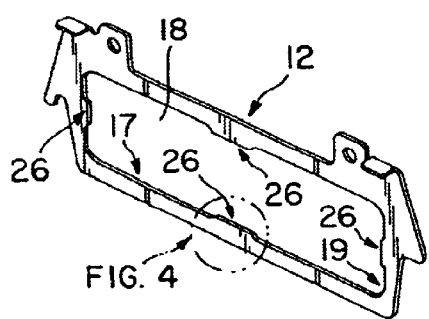
FIG. 3 is a perspective view of the outer frame of the sealing assembly of the present invention.
Figure 4:
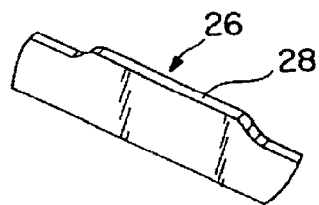
FIG. 4 is a detail view of a portion of the outer frame of the sealing assembly shown in FIG. 3.
Figures 5, 5A:
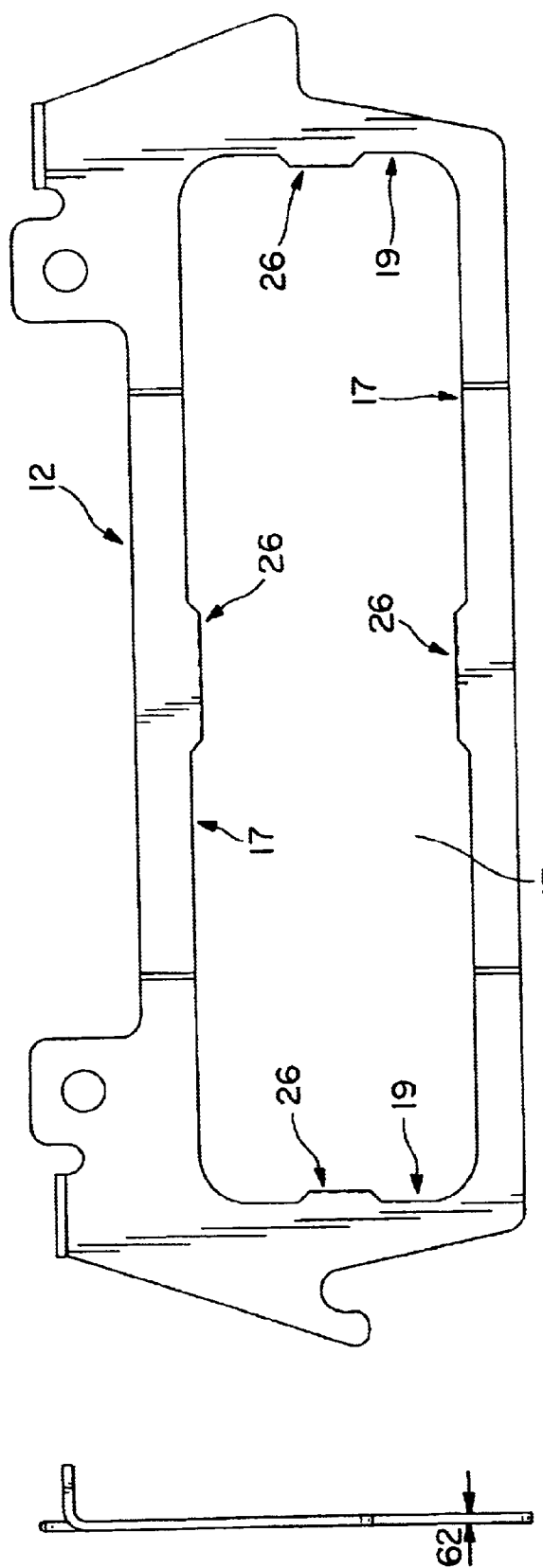
FIG. 5 is a front elevational view of the outer frame of the sealing assembly.
FIG. 5A is a side elevational view of the outer frame shown in FIG. 5.

Referring to FIGS. 1–5, a preferred sealing assembly 10 is shown having an outer frame 12, an inner frame 50, and an O-ring 11 as a preferred sealing member. The outer frame 12 defines a center opening 13, as shown in FIG. 5. The opening 13 is adapted to concentrically receive the inner frame 50. When concentrically combined, the inner frame 50 and the outer frame 12 define a contiguous gap 14 as shown in FIG. 2. The gap 14 is defined by the contours of the inner and outer frames 50, 12, respectively. The O-ring 11 fits in the gap 14 between the outer frame 12 and the inner frame 50, as shown in FIG. 1A, partially filling the gap 14.

Figure 9:
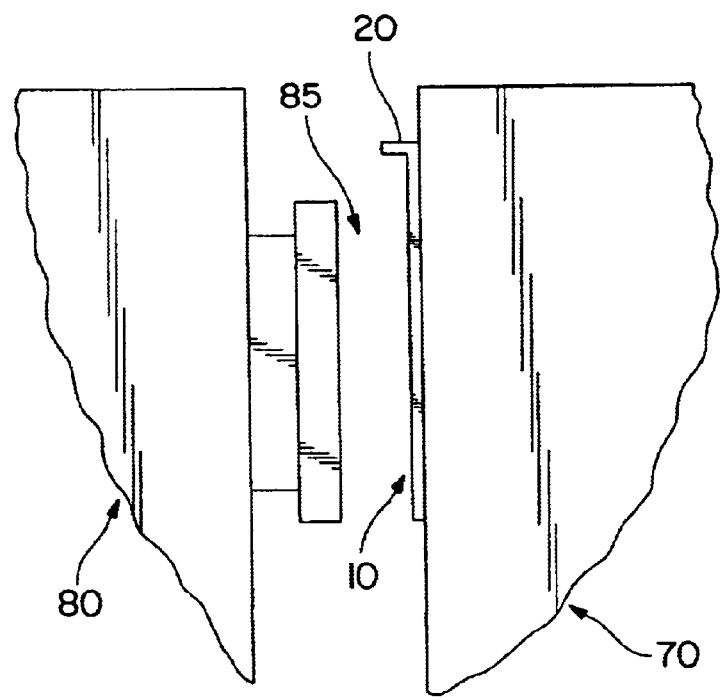
FIG. 9 is a side elevational view of the sealing assembly of the present invention with the processing modules un-seated.
Figure 10:
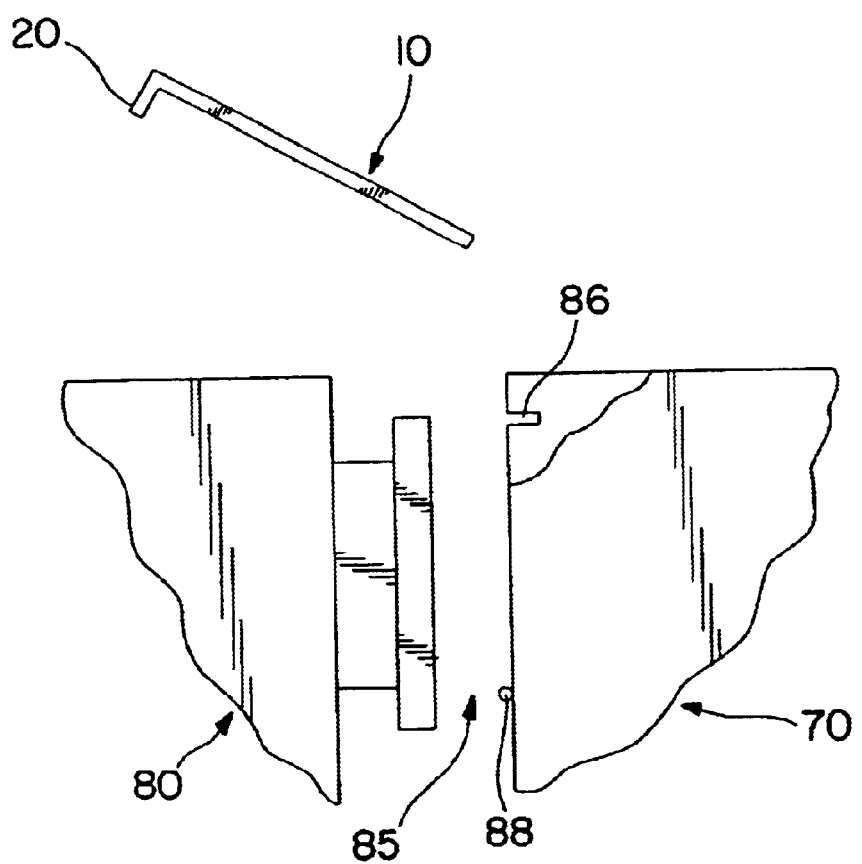
FIG. 10 is a side elevation view of the sealing assembly removed from between the processing modules.

The outer frame 12 further includes alignment openings 16 positioned in upwardly extending members 35. The alignment openings 16 mate with complementary threaded openings 86 on the process module 70 as shown in FIGS. 9–10. The outer frame 12 further includes tabs 20 at opposite ends of the frame extending perpendicularly from the frame 12. The tabs 20 may be spaced a specified distance from each other and of a predetermined thickness and width. The tabs 20 are preferably adapted and designed to extend outwardly to enhance a person to grasp the tabs and facilitate removing and replacing the sealing assembly from between the module 70, and chamber 80, as shown in FIG. 10.

An advantage of the tabs 20 of the present invention is that they enable the sealing assembly to be removed from between the module and the chamber instead of replacing the O-ring seal in situ. Preferably, the present invention uses about a one tenth (0.1) inches opening between the module and the chamber. This simplifies replacing a MESC (Modular Equipment Standards Committee, is a SEMI standard for modular equipment compatibility) seal and reduces system down time. The MESC standard defines and standardizes the size of the rectangular openings, locations of alignment pins and clamping features, and sealing surfaces. Thereby, the opening 85 (shown in FIGS. 9–10) between the modules is minimized because the removable sealing assembly 10 fits into position through a minimal space between the module 70 and the chamber 80, and is accessible and capable of being removed and replaced.

One advantage of the present invention is the reduction of procedural steps when the opening 85 is minimized by minimizing the time spent or entirely eliminating steps including disconnecting gas lines, physically shifting the module and chamber from its floor position, reassembling the modules, and reconnecting any gas lines. Also, the amount of time the system is unavailable is reduced significantly because the physical manipulations required to undock and re-dock the modules, and disconnect and reconnect effected systems is eliminated. Thus, many procedural steps are eliminated, and the amount of time reduced when replacing the O-ring seal using the present invention.

Referring to FIGS. 2–4, the outer frame 12 includes first and second placement elements 22, 24, respectively. The first and second placement elements 22, 24, are located at opposite ends of the outer frame 12. The first placement element 22 is positioned at one end of the outer frame and includes a horizontal surface 23. The second placement element 24 is positioned on the opposite end of the outer frame, and includes a rounded surface 25 adjacent to and contiguous with a concave area 27. The horizontal surface 23 of the first placement element 22, and the concave area 27 of the second placement element 24 contact complimentary features, preferably pins 88, 87, respectively, on the process module 70 which positions the sealing assembly for creating a seal when the modules are docked.

Referring to FIGS. 1 and 2, the outer frame 12 of the sealing assembly 10 further includes alignment opening 16 positioned along the top of the outer frame 12 and adjacent to the lifting tabs 20 of the outer frame 12. The alignment openings 16 are positioned over the process module threaded opening 86. The alignment openings 16 provide a means for checking the positioning of the outer frame 12 on the process module when clamps 31 are used to secure the sealing assembly 10. The alignment openings 16 are adapted to mate with threaded opening 86 on the process module as shown in FIG. 9a. The alignment openings 16 of the outer frame 12 are used by clamps 31 (shown in FIG. 8) which attach the sealing assembly 10 to the process module 70 after positioning the sealing assembly 10 between the process module 70 and transfer chamber 80. The sealing assembly 10 is properly positioned when the bolts 29 holding the clamps 31 will pass through the alignment opening 16 and thread into the threaded opening 86. If the sealing assembly 10 is not positioned correctly between the process module and the transfer chamber, the bolts 29 of the clamps 31 will not pass through the threaded openings 86, thereby indicating that proper alignment has not been achieved.

Referring to FIG. 5, the outer frame 12 defines the outer frame opening 13 generally in its center and having a perimeter defined by the inner surface 19 of the outer frame 12. The outer frame opening 13 further includes two sets of inwardly projecting elements 26 positioned opposite one another and projecting towards one another. The inwardly projecting elements 26 are preferably located about midway along the length side 17 of the outer frame 12, and about midway along the width side 19 of the outer frame 12. The inwardly projecting element 26 of the outer frame 12 urges the O-ring 11 toward the center opening 18. The inwardly projecting element is preferably generally rectangularly shaped and extends inwardly preferably less than half the distance of the gap 14. Thus, a portion of the gap 14 is unoccupied by the O-ring 11, and the O-ring is free to expand when compressed.

Figure 6D:
FIG. 6D is a plan view of the inner frame shown in FIG. 6.
Figure 6:
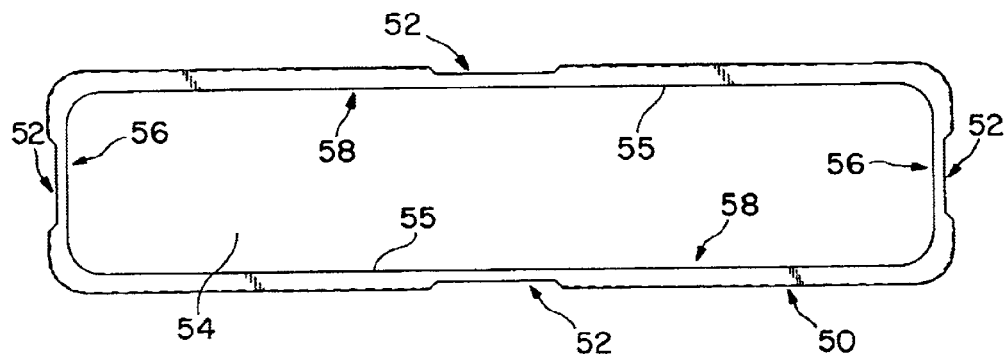
FIG. 6 is a front elevational view of the inner frame of the sealing assembly.
Figure 6C:
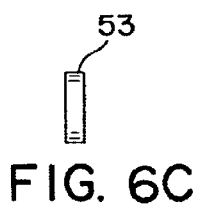

Referring to FIG. 6, the inner frame 50 is shown having recessed areas 52 and defining a generally rectangular inner frame center opening 54. The inner frame includes recessed areas 26 positioned about midway along opposite lengthwise sides 58 of the inner frame 50, and includes recess area 26 positioned about midway along opposite widthwise sides 56 of the inner frame. The inner frame 50 is adapted to fit inside the outer frame 12, such that the O-ring fits between the frames 12, 50. The recessed areas 52 of the inner frame includes the concave shaped area 53 shown in FIG. 6b and FIG. 6c. The O-ring becomes mated between the inner and outer frames. More specifically, the O-ring is mated between the inwardly projecting element 26 and the recessed area 52. The contact between the O-ring and the perimeter of the inner frame and the concave area 28 of the inwardly projecting elements 26 provides a contiguous seal having room for expansion into the unoccupied gap 14. The inner frame 50 fits within the opening 18 of the outer frame 12 such that recesses 52 in the inner frame 50 correspond with the inwardly projecting elements 26. Thus, the O-ring 11 is positioned within the gap 14 by the inwardly projecting elements 26. The portion of the gap 14 which is not filled by the O-ring 11 allows expansion of the O-ring 11 under compression and/or heat. Thus, the O-ring is free to expand and is not over-constrained.

Figure 1B:
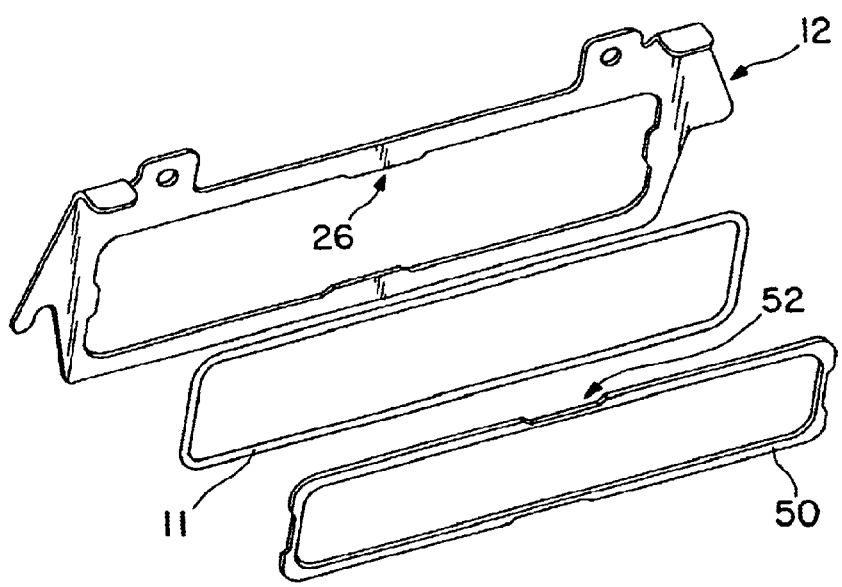
FIG. 1B is an exploded perspective view of the sealing assembly of FIG. 1.
Figures 6A, 6B:
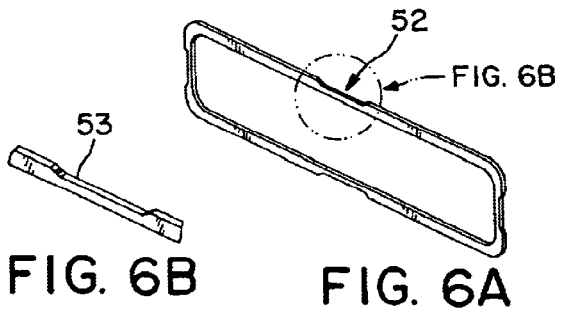
FIG. 6A is a perspective view of the inner frame shown in FIG. 6.
FIG. 6B is a detail view of a portion of the inner frame shown in FIGS. 6 and 6A.
Figure 7A:
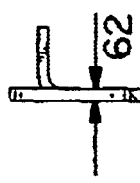
FIG. 7A is a side elevational view of the outer frame shown in FIG. 5.
Figure 7:
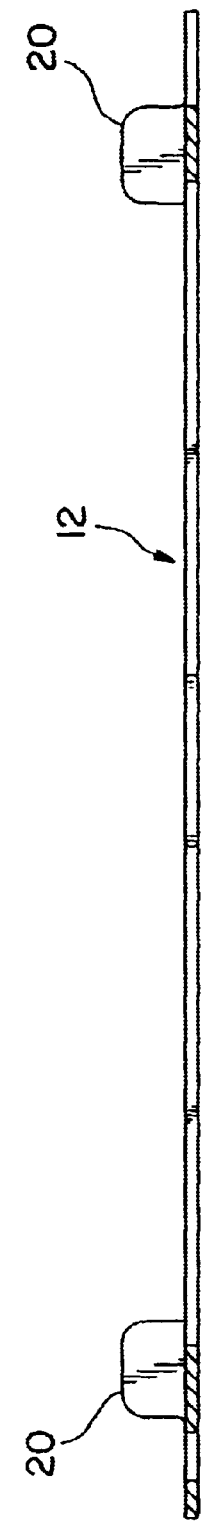
FIG. 7 is a plan view of the outer frame shown in FIG. 5.

Referring to FIGS. 1–5, the sealing assembly 10 defines a center opening 18 having a perimeter defined by the inner edge 55 of the inner frame 50. The opening 18 is generally rectangularly shaped having opposite lengthwise extending sides 17, and opposite extending sides 19 along a width as shown in FIG. 5. Referring to FIG. 1B, the inner and outer frames, 50, 12, respectively are held together by the O-ring 11. The O-ring 11 is designed and adapted to fit around the outer perimeter of the inner frame 50. The O-ring 11 may be seated in a concave shaped area 53 (as shown in FIG. 6B) of the inner frame which deters lateral movement of the O-ring 11, when the O-ring is expanded as when under compression.

Referring to FIG. 4, the inwardly extending area 26 of the outer frame 12 also includes a concave shaped area 28 designed and adapted to accept the O-ring 11 and deter lateral movement of the O-ring 11. The groove 28 preferably defines a concave surface adapted to accept the O-ring 11 and to discourage the O-ring from traveling laterally. When the O-ring is seated within the concave surface of the groove 28 and the inner and outer frames are assembled, the O-ring is encouraged to maintain its position around the outer frame by the concave surface of the groove. The inner frame 50 and outer frame 12 are adapted to fit together such that the O-ring is compressively held between them. More specifically, the O-ring, in its most relaxed state is positioned between the concave surface of the groove 28 of the inwardly projecting element 26 of the outer frame 12 and the perimeter of the inner frame.

In the preferred embodiment, the concentrically positioned inner and outer frames define a gap around the perimeter of the inner frame having a diameter slightly smaller than the outer diameter of the O-ring 11. The O-ring 11 fits into the gap 11 and mates with the outer perimeter of the inner frame 50, and the concave surface of the groove 28 of the inwardly projecting elements 26 of the outer frame 12. The O-ring is slightly compressed between the inner and outer frames. Thus, the inner and outer frames are held in position by compressing the O-ring between them, and lateral movement of the O-ring when positioned between the inner and outer frames is discouraged by the concave surface of the groove 28.

Referring to FIGS. 1a and 2, a furrow 15 partially traversing the thickness of the inner frame 50 extends from the opening 18 and traverses the width of the inner frame 50 to communicate with the gap 14. The furrow 15 allows air to escape from the gap 14 which is defined by the inner and outer frames 50, 12, respectively. The O-ring 11 is positioned in the gap 14 between the inner and outer frames 50, 12, respectively.

Referring to FIG. 6–6D, the inner frame 50 has a thickness 60, shown in FIG. 6d, which is greater than the thickness 62, shown in FIG. 5a of the outer frame 12. When the sealing assembly is assembled the inner frame will protrude outwardly in relation to the outer frame 12. The inner frame surface will meet with the planar surfaces of the processing module 70 and the transfer chamber 80 offering some sealing properties between the two modules. However, the mating of the metal surfaces will allow the gases from the process chamber to escape from between the planar surfaces and contact the O-ring seals. These gases have a detrimental effect on the seal and will cause decay and fatigue of the seal over a period of time. The inner frame acts as an initial contact area between the modules planar surfaces because the inner frame is thicker than the outer frame. The O-ring provides discouragement of the gases escaping and provides a sealing barrier between the modules. Thus, one advantage of the present invention providing an inner frame having a greater thickness than the outer frame is that the seal life is maximized by reducing the interaction between the gases and the O-ring seal.

Another advantage of the present invention is that the inner frame will resist deforming because the thickness of the inner frame is more than the outer frame. The two mating surfaces of the preferred DLCM transfer module 80 and the SPEED processing module 70 secure the inner frame 50 when the sealing assembly 10 is placed between the module and the chamber. When the two modules secure the inner frame between them, increased thickness of the inner frame will discourage pressure differential forces for deforming the inner frame. Deformation of the inner frame is undesirable because torsion of the sealing assembly 10 may result in compromising the seal provided by the O-ring seal.

Figure 8:
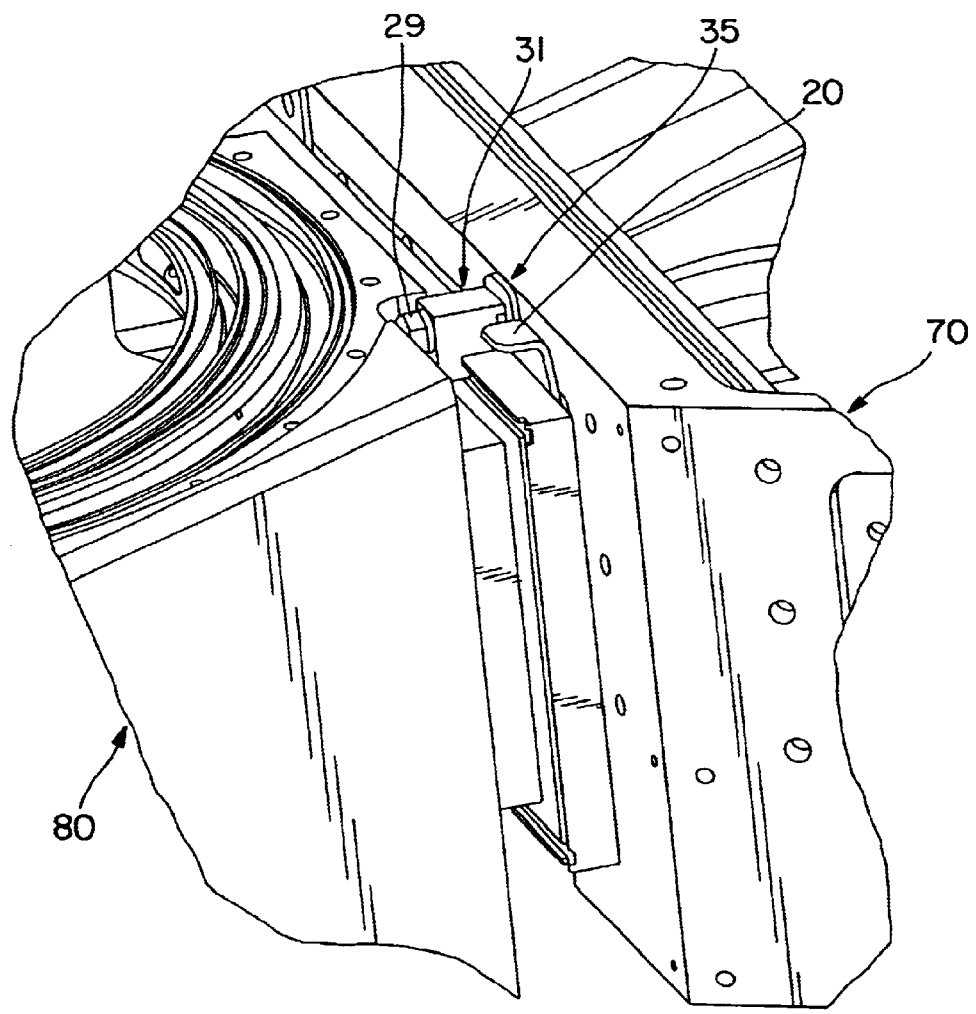
FIG. 8 is a perspective view of the sealing assembly of the present invention seated between processing modules.
Figure 9A:
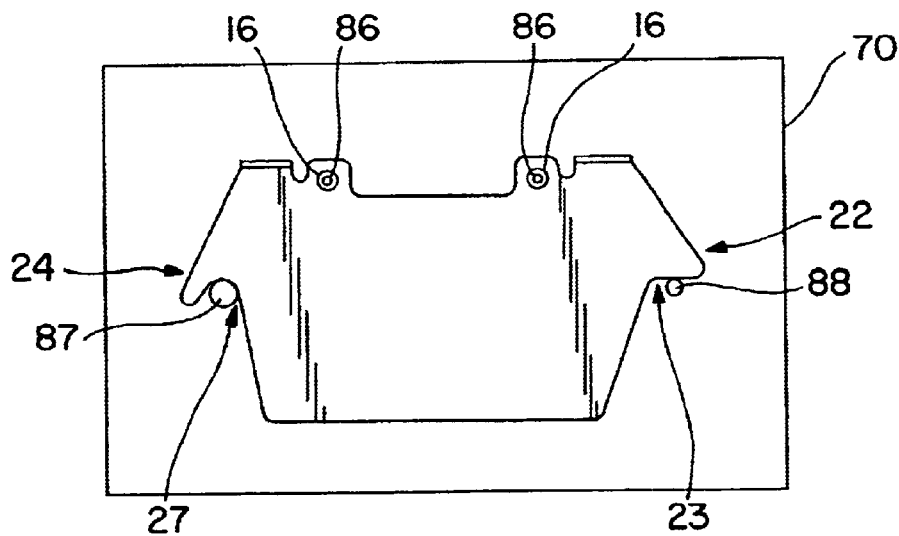
FIG. 9A is a front elevational view of the sealing assembly of the present invention coupled to a processing module.

In operation, referring to FIGS. 8–10, the process module 70 and the transfer chamber 80 are docked with the sealing assembly 10 between them. The lifting tabs 20 are protruding outwardly from the sealing assembly, and the alignment openings 16 are used to attach the sealing assembly to the module using clamps 31. The clamps 31 pass through the alignment opening 16 in the upwardly extending members 35 to align with threaded openings 86 in the process module. Thus, the modules and the sealing assembly are secured together where the sealing assembly provides a seal between modules.

Referring to FIG. 9 the transfer assembly and process module are undocked and the sealing assembly 10 remains in place attached to the process module. The lifting tabs 20 are accessible for removing the sealing assembly. An opening 85 defined between the modules and is preferably about 0.1 inch between the process module and the transfer chamber. This minimizes the movement required between the modules and eliminates or minimizes any movement of their associated supporting structures 100, 101. The opening 85 available between the process module and transfer chamber's such that The sealing assembly can be positioned between the process module and the transfer chamber in the opening 85 without procedures required to move the supporting structures of the transfer chamber and the process module.

Referring to FIG. 10, the undocked process module and transfer assembly provide an opening 85 between the modules. The sealing assembly 11 can then be lifted using the lifting tabs 20 off of the process module through the opening 85 and completely removed, leaving opposing sealable surfaces from the processing module 70 and the transfer chamber 80.

The O-ring can then be replaced by disassembling the sealing assembly as shown in FIGS. 1b, and FIGS. 1–5. The sealing assembly can then be disassembled by removing the inner frame 50 and O-ring 11. The O-ring can be replaced with a new O-ring, and the sealing assembly reassembled with the O-ring between the inner and outer frames.

Referring to FIGS. 8–9A, the sealing assembly 10 can be replaced between the module and the chamber using the tabs 20 which allow the sealing assembly 10 to be returned to its position. Second placement element 24 aligns the sealing assembly 10 when the sealing assembly is placed between the two modules to mate at concave area 27 with a second pin 87 on the process module. The assembly can then be pivotably adjusted about the second pin and concave area 27. The horizontal surface 23 of the first placement element 22 is positioned on the first pin 88 on the process module. The alignment openings 16 fit over and are in alignment with threaded openings 86 on the process module 70. The clamps 31 are positioned to clamp the sealing assembly 10 with the processing module. Screws 29 are positioned through the clamp 31 and threaded into the threaded openings 86. When the sealing assembly is properly positioned on the process module, the screws 29 will properly thread into the threaded openings 86. The sealing assembly is in need of further alignment adjustment if the screws 29 do not thread properly into the threaded openings 86. The sealing assembly has thus been positioned through the opening provided between the process module 70 and the transfer chamber 80 using the lifting tabs and re-coupled to the process module as shown in FIGS. 9 and 9a.

Figure 11:
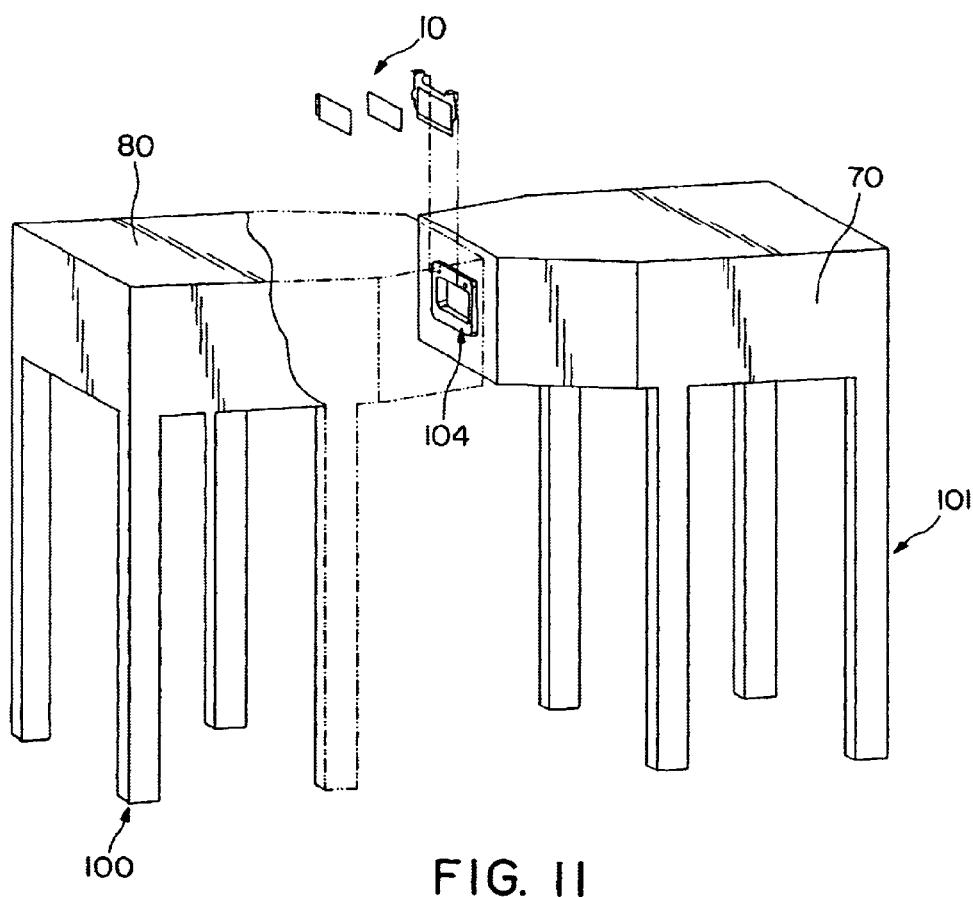
FIG. 11 is a partial cut-away perspective view of the processing modules including an exploded view of the sealing assembly of the present invention.
Figure 12:
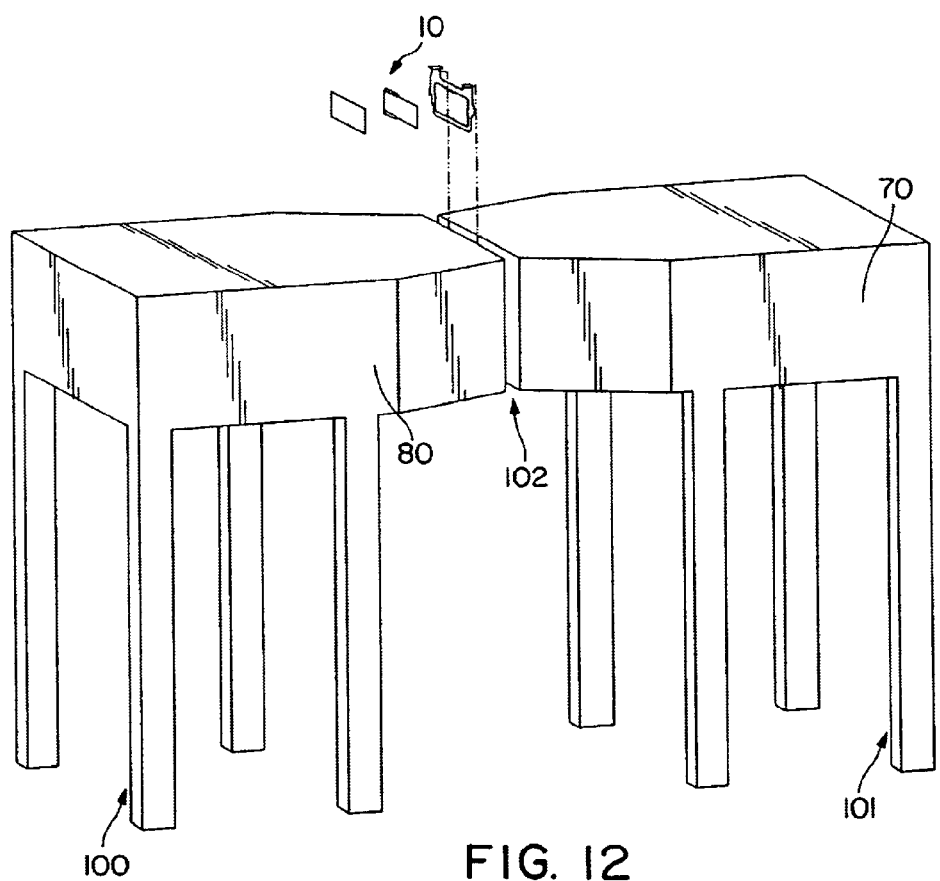
FIG. 12 is a perspective view of the processing modules including an exploded view of the sealing assembly of the present invention.

FIGS. 11 and 12 depict the processing module 70 and the transfer chamber 80, and their associated supporting structure 100, 101 attached to the floor. Referring to FIG. 11, the mounting area 104 which mates with the sealing assembly 10 is shown on the processing module 70. Using the present invention, the supporting structures 100, 101 require little or no movement to replace the sealing assembly. This is a significant advantage because typical modules are large and difficult to move. The sealing assembly 10 of the present invention can fit in the space 102 that is available between the modules. Thus, after the sealing assembly 10 is attached to a process module, as shown in FIG. 9, the modules can be re-docked as shown in FIG. 8 with significantly more efficiency.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A sealing assembly for sealing retractable opposing planar surfaces of processing modules each having sealable cavities for the fabrication of semiconductor wafers, which comprises:

a removable O-ring coupled to said sealing assembly and positioned along a receiving surface of said sealing assembly such that said O-ring is contiguously exposed and adapted to receive at least one said planar surface of said processing modules;

an outer frame defining a substantially central opening and an inner frame being adapted to be concentrically positioned within said central opening of said outer fame, said inner frame has a thickness dimension which is greater than a thickness dimension of said outer frame, and a planar surface of said inner frame complimentarily contacts said planar surfaces of said processing modules;

said O-ring being adapted to fit about a circumference of said inner frame, said O-ring being juxtapositioned between said concentrically positioned inner and outer frames such that said O-ring removably couples said inner and outer frames; and at least one lifting tab attached to an upper portion of said sealing assembly such that said lifting tab is graspable to removably position said sealing assembly between said opposing planar surfaces of said processing modules thereby providing a seal.

2. The sealing assembly of claim 1 wherein said O-ring includes elastomeric material.

3. The sealing assembly of claim 1 wherein said lifting tab extends outwardly at about a 90° angle from a plane defined by said receiving surface of said sealing assembly.

4. The sealing assembly of claim 1 further including an alignment element being adapted to couple to at least one processing module such that said sealing assembly is horizontally and vertically positioned in relation to said processing modules.

5. The sealing assembly of claim 1 wherein said concentrically positioned inner and outer frames define a channel therebetween adapted for removable receiving said O-ring, said inner frame includes an outer edge having a recessed portion complementarily receiving an inwardly protruding portion along an inner edge of said outer frame, and where compressing said O-ring expands said O-ring into said channel.

6. The sealing assembly of claim 1 wherein said opposing surfaces of said processing modules defining an opening therebetween and said removable sealing assembly is adapted to fit into said opening between said opposing planar surfaces of said processing modules; and said opposing surfaces of said modules are movable towards one another coupling said O-ring between said opposing planar surfaces, thereby providing a seal between said opposing planar surfaces of said processing modules.

7. A sealing assembly for sealing retractable opposing planar surfaces of processing modules each having sealable cavities for the fabrication of semiconductor wafers, which comprises:

an outer frame defining a substantially central opening;

an inner frame adapted to be concentrically positioned within said central opening of said outer frame, said inner frame having a thickness dimension which is greater than a thickness dimension of said outer frame, and a planar surface of said inner frame complimentarily contacts said planar surfaces of said processing modules; and an O-ring being adapted to fit about a circumference of said inner frame, said O-ring being juxtapositioned between said concentrically positioned inner and outer frames such that said O-ring removably couples said inner and outer frames.

8. The sealing assembly of claim 7 wherein said concentrically positioned inner and outer frames define a channel therebetween adapted for removable receiving said O-ring, said inner frame includes an outer edge having a recessed portion complementarily receiving an inwardly protruding portion positioned along an inner edge of said outer frame, and where compressing said O-ring expands said O-ring into said channel.

9. The sealing assembly of claim 7 wherein said opposing surfaces of said processing modules defining an opening therebetween and said removable sealing assembly is adapted to fit into said opening between said opposing planar surfaces of said processing modules; and said opposing surfaces of said modules are retractably movable towards one another thereby coupling said O-ring between said opposing planar surfaces to provide a seal between said opposing planar surfaces of said processing modules.

10. The sealing assembly of claim 9 wherein said opening defined by said opposing planar surfaces is less than about 0.25 inches.

11. The sealing assembly of claim 9 wherein said opening is less than about 0.1 inches.

12. The sealing assembly of claim 7 wherein said O-ring includes elastomeric material.

13. The sealing assembly of claim 7 wherein said outer frame defines a concave shaped groove adapted for receiving said O-ring.

14. The sealing assembly of claim 7 wherein said outer frame includes lifting tabs attached to an upper portion of said outer frame such that said lifting tabs are graspable to removably position said sealing assembly between said opposing planar surfaces of said processing modules thereby providing a seal.

15. The sealing assembly of claim 14 wherein said lifting tabs extend outwardly at about a 90° angle from a plane defined by said sealing assembly and parallel to said opposing planar surfaces.

16. The sealing assembly of claim 7 further including an alignment element being adapted to couple to at least one processing module such that said sealing assembly is horizontally and vertically positioned in relation to said processing modules.

17. A sealing assembly for sealing retractable opposing planar surfaces of processing modules each having sealable cavities for the fabrication of semiconductor wafers, which comprises:

a first removable O-ring coupled to said sealing assembly and positioned along a receiving surface of said sealing assembly such that said first O-ring is contiguously exposed and adapted to receive at least one said planar surface of said processing modules; and at least one lifting tab attached to an upper portion of said sealing assembly such that said lifting tab is graspable for removing said sealing assembly from between said opposing planar surfaces of said processing modules, replacing said first removable O-ring with a second removable O-ring and replacing said sealing assembly between said opposing planar surfaces thereby providing a seal.

18. The sealing assembly of claim 17 wherein said opposing surfaces of said processing modules defining an opening therebetween and said removable sealing assembly is adapted to fit into said opening between said opposing planar surfaces of said processing modules; and said opposing surfaces of said modules are movable towards one another coupling said O-ring between said opposing planar surfaces, thereby providing a seal between said opposing planar surfaces of said processing modules.

19. The sealing assembly of claim 18 further including an alignment element being adapted to couple to at least one processing module such that said sealing assembly is horizontally and vertically positioned in relation to said processing modules.

20. The sealing assembly of claim 19 further including at least one clamp for clamping said sealing assembly to said processing module.

21. The sealing assembly of claim 20 wherein said lifting tab extends outwardly at about a 90° angle from a plane defined by said receiving surface of said sealing assembly.

* * * * *

UNITED STATES PATENT AND TRADEMARK OFFICE
CERTIFICATE OF CORRECTION

PATENT NO.     : 6,722,665 B1
DATED          : April 20, 2004
INVENTOR(S)    : Christopher W. Burkhart et al.

It is certified that error appears in the above-identified patent and that said Letters Patent is hereby corrected as shown below:

Column 1,
Line 51, delete "houses" and substitute therefor -- house --;

Column 2,
Line 11, delete "to";

Column 3,
Lines 6, 26 and 65, after "aspect" insert -- of --;
Lines 17 and 56, delete "removable" and substitute therefor -- removably --;

Column 5,
Line 25, delete "elevation" and substitute therefor -- elevational --;

Column 6,
Line 13, delete "inches" and substitute therefor -- inch --.

Column 7,
Lines 25 and 26, delete "26" and substitute therefor -- 52 --

Column 8,
Line 13, delete the second occurrence of "11" and substitute therefor -- 14 --;
Line 31, delete "FIG." and substitute therefor -- FIGS. --;

Column 9,
Line 32, delete "FIGS. 1b, and".

Signed and Sealed this

Twenty-ninth Day of June, 2004

JON W. DUDAS
*Acting Director of the United States Patent and Trademark Office*